United States Patent
Busche et al.

(10) Patent No.: US 11,424,170 B2
(45) Date of Patent: Aug. 23, 2022

(54) METHOD FOR MOUNTING AN ELECTRICAL COMPONENT IN WHICH A HOOD IS USED, AND A HOOD THAT IS SUITABLE FOR USE IN THIS METHOD

(71) Applicant: Siemens Aktiengesellschaft, Munich (DE)

(72) Inventors: Nora Busche, Berlin (DE); Joerg Strogies, Berlin (DE); Klaus Wilke, Berlin (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 68 days.

(21) Appl. No.: 15/301,772

(22) PCT Filed: Mar. 30, 2015

(86) PCT No.: PCT/EP2015/056912
§ 371 (c)(1),
(2) Date: Oct. 4, 2016

(87) PCT Pub. No.: WO2015/150335
PCT Pub. Date: Oct. 8, 2015

(65) Prior Publication Data
US 2017/0033024 A1 Feb. 2, 2017

(30) Foreign Application Priority Data
Apr. 4, 2014 (DE) ...................... 10 2014 206 601.8

(51) Int. Cl.
*H01L 23/057* (2006.01)
*H01L 23/498* (2006.01)
(Continued)

(52) U.S. Cl.
CPC ........ *H01L 23/057* (2013.01); *H01L 21/4875* (2013.01); *H01L 21/4882* (2013.01);
(Continued)

(58) Field of Classification Search
CPC ............. H01L 21/4875; H01L 23/3731; H01L 2924/16152
See application file for complete search history.

(56) References Cited

U.S. PATENT DOCUMENTS

| 5,929,516 A | 7/1999 | Heerman et al. ............. 257/701 |
| 5,986,334 A * | 11/1999 | Lee ......................... H01L 23/13 |
| | | 257/667 |

(Continued)

FOREIGN PATENT DOCUMENTS

| CN | 102496612 A | 6/2012 | ........... H01L 23/552 |
| CN | 102738131 A | 10/2012 | ............. H01L 21/56 |

(Continued)

OTHER PUBLICATIONS

Kandasamy, Ravi et al., "Application of Phase Change Materials in Thermal Management of Electronics," Applied Thermal Engineering, No. 27, pp. 2822-2832 (11 pages), Jan. 10, 2007.

(Continued)

*Primary Examiner* — Mark W Tornow
*Assistant Examiner* — Abbigale A Boyle
(74) *Attorney, Agent, or Firm* — Slayden Grubert Beard PLLC

(57) ABSTRACT

A method for mounting an electrical component on a substrate is disclosed. According to the method, joining is simplified using a cover, or hood, that includes a contact structure on an inner side of the hood, wherein when the hood is mounted, the contact structure is joined to the underlying structure at different joining levels simultaneously using an additional material. Moreover, a joining (Continued)

pressure, e.g., for diffusion or sintered bonds for electrical contacts, can be applied using such a hood.

5 Claims, 1 Drawing Sheet

(51) Int. Cl.
| | | |
|---|---|---|
| *H01L 23/373* | (2006.01) | |
| *H01L 23/00* | (2006.01) | |
| *H01L 21/50* | (2006.01) | |
| *H01L 23/10* | (2006.01) | |
| *H01L 21/48* | (2006.01) | |
| *H01L 23/473* | (2006.01) | |

(52) U.S. Cl.
CPC ............ *H01L 21/50* (2013.01); *H01L 23/10* (2013.01); *H01L 23/3731* (2013.01); *H01L 23/3735* (2013.01); *H01L 24/83* (2013.01); H01L 23/473 (2013.01); H01L 23/49833 (2013.01); H01L 24/29 (2013.01); H01L 24/32 (2013.01); H01L 24/33 (2013.01); H01L 24/75 (2013.01); H01L 2224/29111 (2013.01); H01L 2224/29116 (2013.01); H01L 2224/29294 (2013.01); H01L 2224/29339 (2013.01); H01L 2224/32225 (2013.01); H01L 2224/33181 (2013.01); H01L 2224/753 (2013.01); H01L 2224/8382 (2013.01); H01L 2224/8384 (2013.01); H01L 2224/83192 (2013.01); H01L 2224/83439 (2013.01); H01L 2224/83444 (2013.01); H01L 2224/83447 (2013.01); H01L 2924/1033 (2013.01); H01L 2924/10253 (2013.01); H01L 2924/10272 (2013.01); H01L 2924/10329 (2013.01); H01L 2924/15192 (2013.01); H01L 2924/165 (2013.01); H01L 2924/1679 (2013.01); H01L 2924/16152 (2013.01); H01L 2924/16235 (2013.01); H01L 2924/16251 (2013.01); H01L 2924/16787 (2013.01)

(56) References Cited

U.S. PATENT DOCUMENTS

| 6,207,475 | B1 | 3/2001 | Lin et al. ................. 438/108 |
| 6,340,842 | B1 | 1/2002 | Nakamura ................. 257/724 |
| 6,538,322 | B2 | 3/2003 | Nakamura ................. 257/723 |
| 6,812,559 | B2 | 11/2004 | Palm et al. ................. 257/691 |
| 7,012,315 | B1* | 3/2006 | Campbell ............ H01L 23/04 257/433 |
| 7,468,548 | B2* | 12/2008 | Wu ................. H01L 21/4828 257/675 |
| 7,525,187 | B2 | 4/2009 | Speckels et al. ............ 257/688 |
| 7,893,514 | B2* | 2/2011 | Kwon ............ H01L 27/14618 257/432 |
| 8,201,326 | B2 | 6/2012 | Ewe et al. ................. 29/832 |
| 8,253,229 | B2* | 8/2012 | Yamano .......... H01L 25/105 257/686 |
| 8,803,185 | B2* | 8/2014 | Ling ................. H01L 33/005 257/99 |
| 8,927,345 | B2* | 1/2015 | Yap ............... H01L 23/49861 438/127 |
| 8,975,117 | B2 | 3/2015 | Otremba et al. ............ 438/118 |
| 2007/0262470 | A1 | 11/2007 | Ichiryu et al. ............... 257/783 |
| 2008/0017409 | A1 | 1/2008 | Takeuchi et al. ............ 174/260 |
| 2008/0076209 | A1 | 3/2008 | Klink et al. ............... 438/112 |
| 2008/0111230 | A1* | 5/2008 | Kim ................... H01L 23/5389 257/700 |
| 2009/0321912 | A1 | 6/2009 | Watanabe et al. ........... 257/686 |
| 2011/0266666 | A1 | 3/2011 | Maeda et al. ............... 257/698 |
| 2012/0018895 | A1* | 1/2012 | Oganesian ............ H01L 23/481 257/773 |
| 2012/0020026 | A1* | 1/2012 | Oganesian ........ H01L 21/76877 361/707 |
| 2012/0074592 | A1 | 3/2012 | Luan ......................... 257/777 |
| 2012/0106109 | A1 | 5/2012 | Kim et al. ................. 361/771 |
| 2013/0015544 | A1 | 1/2013 | Han et al. ................. 257/428 |
| 2013/0056844 | A1* | 3/2013 | Oganesian ........ H01L 27/14618 257/443 |
| 2013/0201631 | A1 | 8/2013 | Parker et al. ................ 361/728 |
| 2014/0008811 | A1* | 1/2014 | Yap ................... H01L 23/49861 257/774 |

FOREIGN PATENT DOCUMENTS

| CN | 202495439 U | 10/2012 | ............ H01L 23/32 |
| DE | 10062108 A1 | 6/2002 | ............ H01L 23/373 |
| DE | 102007047698 A1 | 4/2008 | ............ H01L 21/58 |
| DE | 102007036045 A1 | 2/2009 | ............ H01L 21/52 |
| DE | 102007057346 B3 | 6/2009 | ............ H01L 23/04 |
| DE | 102009059236 A1 | 7/2010 | ............ H01L 21/58 |
| DE | 102009016112 A1 | 10/2010 | ............ H01L 23/488 |
| DE | 102013101258 A1 | 8/2013 | ............ H01L 21/603 |
| JP | 2003031724 A | 1/2003 | ............ H01L 23/12 |
| JP | 2006352080 A | 12/2006 | ............ H01L 25/07 |
| JP | 2007324550 A | 12/2007 | ............ H01L 23/12 |
| JP | 2010206142 A | 9/2010 | ............ H01L 21/60 |
| JP | 2011228631 A | 11/2011 | ............ H01L 23/12 |
| JP | 2014011236 A | 1/2014 | ............ H01L 21/60 |
| WO | 96/09646 A1 | 3/1996 | ............ H01L 21/60 |
| WO | 2015/150311 A1 | 10/2015 | ............ H01L 23/00 |
| WO | 2015/150335 A1 | 10/2015 | ............ H01L 21/50 |

OTHER PUBLICATIONS

Bachnak, Nouhad, "3D-MID Technology MEMS Connectivity and System Level," IEEE Electronics Pacakaging Technology Conference, pp. 572-576 (5 pages), 2012.
Psota, Boleslav et al., "Usage of LTCC Technology in Electronic Packaging," 36th Int. Spring Seminar on Electronics Technology, IEEE, pp. 206-209 (4 pages), 2013.
German Search Report, Application No. 102014206601.8, 8 pages, dated Aug. 22, 2014.
German Search Report, Application No. 102014206608.5, 8 pages., dated Aug. 22, 2014.
International Search Report and Written Opinion, Application No. PCT/EP2015/056912, 16 pages, dated Jul. 7, 2015.
International Search Report and Written Opinion, Application No. PCT/EP2015/056867, 21 pages, dated Jul. 7, 2015.
U.S. Non-Final Office Action, U.S. Appl. No. 15/301,787, 20 pages., dated Apr. 19, 2017.
U.S. Notice of Allowance, U.S. Appl. No. 15/301,787, 16 pages, dated Feb. 9, 2018.
U.S. Final Office Action, U.S. Appl. No. 15/301,787, 16 pages, dated Sep. 20, 2017.
Japanese Office Action, Application No. 2017503061, 5 pages, dated Sep. 19, 2017.

* cited by examiner

METHOD FOR MOUNTING AN ELECTRICAL COMPONENT IN WHICH A HOOD IS USED, AND A HOOD THAT IS SUITABLE FOR USE IN THIS METHOD

CROSS-REFERENCE TO RELATED APPLICATIONS

This application is a U.S. National Stage Application of International Application No. PCT/EP2015/056912 filed Mar. 30, 2015, which designates the United States of America, and claims priority to DE Application No. 10 2014 206 601.8 filed Apr. 4, 2014, the contents of which are hereby incorporated by reference in their entirety.

TECHNICAL FIELD

The invention relates to a method for mounting an electrical component on a substrate, wherein the component has a bottom side facing toward the substrate and has a top side situated opposite said bottom side. In the method, the bottom side of the component is mechanically connected to the assembly provided by the substrate. The top side of the component is then mechanically connected to a contacting structure. Here, the joining connections that are formed during the joining process are situated in at least two different joining levels.

BACKGROUND

The invention also relates to a cover for an electrical assembly, wherein the assembly has a substrate and at least one component mounted on said substrate. The cover has a support surface by way of which said cover can be placed onto the substrate. Furthermore, the cover has a cavity in which the component can be received. The component has contact both on its top side and on its bottom side by way of which said component is mounted on the substrate. Said contacts are thus situated at different joining levels.

The joining levels are defined in that, during the mounting on a substrate and during the establishment of contact, the contact of electronic components are situated on different planes, wherein here, the expression plane is meant in the technical sense rather than the mathematical sense. A plane, or the associated joining level, defines regions in which certain joining connections of the components to be contacted are situated. By way of the arrangement of components one above the other, the joining levels are preferably likewise situated one above the other, in particular in a parallel orientation with respect to one another.

Methods for the mounting of electronic components on substrates are known. Said mounting methods are also used in the mounting of electronic assemblies in the power electronics field. For example, DE 100 62 108 A1 describes that a power module can be formed in the case of which the electronic power components can be connected to the substrate by way of a sintered layer. The substrate may involve DCB (direct copper bond) ceramic substrates such as are commonly used in the power electronics field. The top sides of the power components could be connected by way of a sintered layer to, for example, an additional thermal capacity, which provides a cooling body. Likewise, the substrate may, by way of its bottom side, be connected by way of a sintered layer to a further cooling body.

From DE 10 2007 047 698 A1, it is known that the sintered connections of electronic assemblies can be manufactured with the aid of special tools. Said tools have pressure surfaces which make contact with the component parts to be sintered, such that, during the sintering treatment, a pressure can be exerted on said components. By way of tolerance compensation in the tool, it can be ensured that the applied pressure is uniform even if the assembly to be sintered has tolerance-induced manufacturing inaccuracies. During the sintering treatment, in addition to the pressure build-up, it is necessary for a certain sintering temperature to be attained over a defined period of time. It is also possible for soldered connections to be provided instead of sintered connections.

According to US 2013/0201631 A1, it must be ensured that the temperatures required for the sintering process are selected such that joining connections that have already been produced in the assembly are not melted again by the heat treatment presently taking place. This is achieved in that the component connections already formed before the respective connecting process have connecting materials whose process temperatures (softening temperature, sintering temperature, melting temperature) lie, with a sufficient safety margin, above those process temperatures of the connecting process presently taking place. In this way, the joining connections that have already been formed are not put at risk, in terms of their integrity, by the connecting process presently taking place.

After the components have been mounted on the substrate, it is generally also necessary for contacting of said components to the substrate to be realized by way of suitable contacting structures. Here, contacts situated on the top side of the component are connected to corresponding contacts on the substrate. For this purpose, aside from the generally known bonding wires, it is also possible, as per US 2012/0106109 A1, for use to be made of metallic conductive structures which may for example be part of a leadframe. The suitably bent conductive structures are preferably connected to the respective contact surfaces by way of sintering or soldering. Another possibility consists in providing the contacting structures by way of flexible foils onto which the conductive structure is printed, for example. The flexible foils may also be connected, as per DE 10 2009 016 112 A1, to the respective contact surfaces of the top side of the component and to the mounting side of the substrate by way of sintered connections.

Owing to the levels of electrical power implemented in power electronics structures, the power electronics assemblies are subjected to high thermal and electrical load, as a result of which the electrical connections and other joining connections must exhibit high reliability. Sintered connections in particular are particularly suitable for this purpose because their thermal stability, and flawless formation of the joining connection, can be ensured. However, the mounting of power electronics assemblies by way of sintered connections presently entails a certain amount of additional outlay in terms of manufacture, for example in relation to soldering.

SUMMARY

One embodiment provides a method for mounting an electrical component on a substrate, wherein the component has a bottom side facing toward the substrate and a top side situated opposite said bottom side, the method comprising mounting the component onto the substrate, forming a cover including integrated conductor paths that define a contacting structure, and mounting the cover onto a mounting side of the substrate and onto the top side of the component mounted on the substrate, such that the cover laterally traverses the component, first contact surfaces of the contacting structure laterally outside the component contact the substrate at a first joining level defined at the mounting side of the substrate, and electrical contact is generated between second contact surfaces of the contacting structure and the component at a second joining level defined at the top side of the component, the second joining level being different than the first joining level.

In one embodiment, the component and the cover are assembled before joining connections on the component in the first joining level and in the second joining level are completed in one and the same working step by way of a temperature increase or a temperature and pressure increase.

In one embodiment, the substrate, by way of its rear side which is averted from the mounting side and which provides a third joining level, is assembled with a component part before a connection between the component part and the substrate is completed in the working step in which the joining connections on the component in the first joining level and in the second joining level are also completed.

In one embodiment, the cover has, on the outside, a planar surface which runs parallel to the substrate.

In one embodiment, on the inner side, at least one joining surface is provided which, during the mounting on the substrate, enters into engagement with the component.

In one embodiment, the joining surface is brought into engagement with the top side of the electrical component, wherein the contact surface thus generated is situated outside the electrical contacting.

In one embodiment, the completion of the joining connections is performed by diffusion soldering or sintering.

In one embodiment, the contacting structure is provided, on contact surfaces, with an additional material before the cover is placed onto the substrate.

Another embodiment provides a cover for an electrical assembly which has a substrate and at least one component mounted on said substrate, wherein the cover has a support surface by way of which said cover can be placed onto the substrate, has a cavity in which the component can be received, wherein a contacting structure running on the inner side of the cover is provided, which contacting structure leads from the support surface into the cavity.

In one embodiment, an additional material is applied, in the cover, to the contact surfaces of the contact structure.

In one embodiment, the cover is designed as an LTCC component or as an MID component.

In one embodiment, the support surface is formed by an edge of the cover.

In one embodiment, the outer side of the cover is planar.

BRIEF DESCRIPTION OF THE DRAWINGS

Example aspects and embodiments of the invention are described below with reference to the drawings, in which.

DETAILED DESCRIPTION

Figure 1:
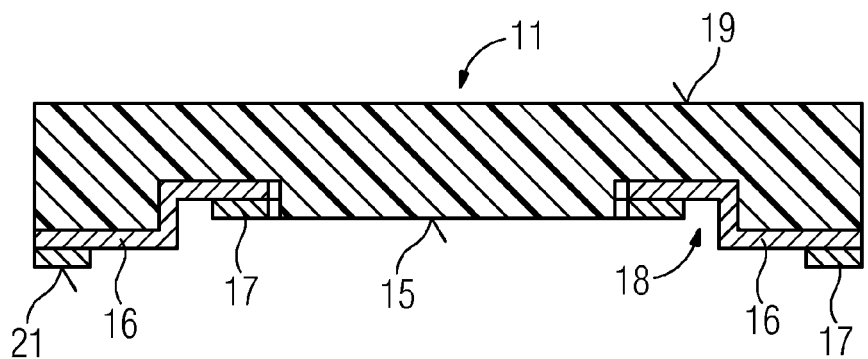
FIG. 1 shows a schematic cross section of an example embodiment of the cover according to the invention, and also showing the first step of an example embodiment of the method according to the invention.

Embodiments of the invention provide a method for mounting an electrical component on a substrate, wherein said method is simplified and also permits the mounting of power electronics components. Furthermore, it is the object to specify a cover of the type mentioned in the introduction which can be used in said improved method.

In some embodiments of the method, the contacting structure is constructed, in the form of conductor paths, on the inner side of a cover. During the mounting, said cover is placed onto a mounting side of the substrate, wherein electrical contacting of the contacting structure with the substrate is generated within a first joining level which is provided by the mounting side of the substrate. The cover traverses the component and, on the inner side of the cover, electrical contacting is generated between the contacting structure and the component within a second joining level at the level of the top side of the component. This means that contact surfaces of the contacting structure are provided in each case at a first joining level at the level of the mounting side of the substrate and at a second joining level at the level of the top side of the component. The contacting structure thus bridges two different joining levels, which can advantageously be reliably joined in one mounting step, by virtue of the cover being placed on, without the aid of bonding wires or exposed lead frames, for example. Here, it is also possible for manufacturing tolerances in the contacting of contact surfaces in different joining levels to be reduced, because these can be integrated in a component that can be manufactured relatively easily and precisely, that is to say the cover, already during the production thereof. Retroactive mounting of individually standing contacting structures is therefore not necessary. Positioning of the contacting structures is advantageously realized jointly with the positioning of the cover on the substrate.

In one embodiment, the substrate, the component and the cover with the contacting structure are firstly positioned relative to one another in the configuration to be produced. Only thereafter is it intended to complete the joining connections, in particular electrical connections, on the component within the at least two joining levels in one and the same working step by way of a temperature increase or a temperature and pressure increase. In other words, the disclosed method for mounting the electronic assembly on the substrate is intended to take place in two defined process segments. In the first process segment, all of the component parts, which are to be mounted, of the assembly provided by the substrate are positioned relative to one another. Here, it is also the case that the joining connections are formed, though these are not yet completed. In the second manufacturing phase, the joining connections are completed. For this purpose, it is necessary to use a suitable joining method, wherein, depending on the type of mechanical connections to be produced, a temperature increase (for example in the case of soldering) or a temperature and pressure increase (for example in the case of diffusion soldering or in the case of sintering) is necessary. It is advantageously provided that said joining connections can be produced in one working step. For this purpose, it is necessary for all of the joining connections to be produced to be configured for the process parameters set during said single working step. Here, a certain temperature level is reached. Furthermore, it is additionally possible for a pressure to be exerted at least on part of the connections. The respectively selected connection type, and any additional material required, need not necessarily be exactly the same in the case of all joining connections. It is essential merely that the process parameters in the case of all connection types and materials are coordinated with one another and, in this way, the simultaneous formation of all joining connections in one working step is possible. By way of the simultaneous formation of all joining connections, it is advantageously also possible, in particular, for contacting structures to be mounted whose in particular electrical connections are situated on different joining levels. Here, said joining levels can be bridged without the need for an additional working step for forming the joining connections. This is advantageously realized by virtue of the bottom side of the component being situated within a first joining level, which is provided by a mounting side of the substrate, and the top side of the component being situated within a second joining level. The first joining level is defined by the plane that is normally provided by the substrate. The group of joining connections by way of which in each case the bottom side of the electrical components on the substrate is contacted lies on said plane (which in the case of non-planar substrates, such as for example housings, need not imperatively be planar in the mathematical sense). The top side of the components then defines, if said top side has electrical contact surfaces, a second joining level which is spaced apart from the first joining level by the spatial height extent of the electrical components. By way of different heights of the electrical components, it may be the case that the second joining level does not lie in a plane, wherein the sum of all contact surfaces on the respective top side of components defines said joining level.

If multiple electrical components are stacked one on top of the other, it is accordingly the case, in each "tier" of the stack, that further joining levels are formed which, during the electrical connection, must possibly be bridged by way of corresponding contact structures. The arrangement of the electrical components such that their contacts can be assigned to in each case different joining levels advantageously facilitates the mounting of the electrical assembly, in the case of which the components and contact structures can be pre-mounted (that is to say positioned relative to one another) level by level, in order for the preferably electrical connections in all joining levels to then subsequently be produced in one working step.

In a further embodiment, the substrate, by way of its rear side which is averted from the mounting side, provides a contact surface by way of which a third joining level is provided. A component part is positioned within said joining level. Subsequently, a connection between the component part and the substrate is completed, by way of a temperature increase or a temperature and pressure increase, in precisely that working step in which the joining connections on the electrical component in the first joining level and in the second joining level (and possibly further joining levels) are also completed. A further simplification of the mounting process is advantageously possible in this way. The greater the number of different joining levels that can be incorporated in one working step during the manufacture of the connections, the greater the extent to which the mounting process is simplified, which ultimately also has an advantageous effect on the profitability of said process.

The component part that is mounted on the rear side of the substrate may for example be a cooling body which serves, in the case of power electronics assemblies, for a dissipation of heat losses. Said cooling body may also be in the form of a main body, wherein said main body is provided for the common mounting of multiple electronic assemblies. Another possibility consists in the substrate being populated with electrical components on both sides. In this case, it would for example be possible for cooling to be realized by way of cooling ducts in the substrate.

In a particular embodiment, all of the joining connections are completed by way of one and the same joining method. As already mentioned, it is likewise possible for different joining methods to be selected for the individual joining connections. However, it is necessary to satisfy the condition that the different selected joining methods can be performed under the predefined process conditions (pressure, temperature). In particular, the temperature must be constant over the entire electrical assembly to be mounted. The pressure may vary, for example as a result of multiple joining tools being used or by virtue of a joining tool being provided in the case of which, for example by way of spring mechanisms with different spring stiffness, different manufacturing pressures are applied to different components of the structure to be joined. Said conditions also apply in the situation in which all of the electrical connections are completed by way of one and the same joining method. It is particularly advantageously also possible, in the case of the selected joining method (in particular diffusion soldering or sintering), for the same additional material to be selected, such that the manufacturing conditions for the joining method are uniform for the entire assembly. It is however also possible for different additional materials to be selected, if these can be completed under the predefined joining conditions in the manner discussed above.

In another embodiment, aside from the joining connections, the connection between the component part (for example the cooling body) and the substrate (on the rear side) is also completed by way of the selected joining method. In this way, the discussed advantages can also be extended to the joining of the connection between the component part and the substrate, which can be completed in one working step together with the joining connections on the mounting side of the substrate. It is self-evidently also possible for the connections on the rear side of the substrate to be electrical connections if the component part that is mounted there is an electrical component part.

In another embodiment, diffusion soldering or sintering is used as a joining method. These methods are particularly advantageously suitable if it is sought to mount power electronics, because the connections formed have a low defect density and exhibit high thermal stability. Diffusion soldering has a method procedure similar to sintering. An additional material is introduced into the region between the component parts to be joined, wherein said material, under the action of temperature and possibly elevated pressure, contributes to a diffusion of alloy components of low melting point and of high melting point. By way of these local changes in concentration, intermetallic phases of high melting point are generated in the joining zone and at the boundaries thereof to the adjacent component parts, which intermetallic phases exhibit high temperature stability. The connection formed exhibits very high electrical and thermal conductivities, and high mechanical strength.

It may also advantageously be provided that, before the positioning in the configuration to be produced, an additional material is applied to the substrate and/or to the component and/or to the contacting structure in the cover and/or to the component part. As already mentioned, said additional materials may facilitate the joining, for example the sintering or the diffusion soldering. The connection constituents responsible for the sintering processes or diffusion processes may however also be contained in the contact surfaces for the connection to be formed. In the case of classic soldering, however, it is always the case that a solder material is required as additional material.

In another embodiment, the cover has, on the outside, a planar surface which runs parallel to the substrate. This has major advantages for the procedure of the mounting method, which is thereby simplified. Specifically, a planar surface makes it possible for a joining tool, by way of which the pressure can be exerted on the assembly to be mounted, to be easily placed on. It is furthermore also possible for the required process heat to be introduced by way of said tool, if said tool is heated. The transmission of the process heat to the components to be joined, in particular the cover, is likewise improved if a planar surface is provided which extends in particular over the entire areal extent of the cover. A further advantage consists in that the joining tool does not need to be geometrically adapted to the cover. The joining tool may be equipped, as standard, with a planar surface for exerting pressure, wherein it is basically possible for covers for different applications, that is to say for example of different size or with different structuring of the inner side, to be mounted using one and the same joining tool.

Another embodiment is obtained if, on the inner side, at least one joining surface is provided which, during the mounting on the substrate, enters into engagement with the component. In this way, it is advantageously possible for the component, too, to be uniquely oriented, and fixed, relative to the substrate in at least one spatial direction by virtue of the cover being placed on. For example, the joining surface may be provided as a horizontal surface on the inner side of the cover. Such a joining surface permits the positioning of the component in a direction perpendicular to the surface of the substrate. By way of the joining surface, it is in particular also possible for a required pressure to be built up, said pressure being required for the joining of the electrical contacts for example by way of a sintering treatment or for the formation of diffusion-soldered connections. Here, the generation of the joining pressure is realized as a result of an oversize of the joining surface in relation to the placed-on level of the cover on the substrate, which leads to an elastic deformation of the cover. In other words, the clear height in the cavity, formed by the cover on the substrate, under the component is smaller than the structural height of the component in the populated state on the substrate. In this way, a joining force P is realized which is transmitted for example via a joining tool.

In another embodiment, the contacting structure is provided, on the contact surfaces, with an additional material before the cover is placed onto the substrate. The additional material is intended to ensure reliable formation of the joining connections. Said additional material may for example be composed of a diffusion solder if diffusion soldering is to be performed. It is also possible for a sinter material to be used if it is sought to produce a sintered connection. Other possibilities consist in the use of a solder material, in particular a high-temperature solder. The use of sintering materials, diffusion solders or high-temperature solders is particularly advantageous if the assembly is to be equipped with power electronics components. These heat up relatively intensely during operation, as a result of which the thermal loads must also be borne by the electrical contactings that are formed. The contacting structure may be provided with the additional material; this furthermore has the advantage that the component itself does not have to be provided with an additional material. The additional materials required may be applied to the substrate and to the contacting structure. Here, it is advantageously sufficient for only two components, specifically the substrate and the cover, to be provided with the additional material. This is, in terms of handling, easier than if, instead, it were necessary for multiple components to be provided with the additional material.

Another embodiment provides a cover including a contacting structure on the inner side of the cover, which contacting structure leads from the support surface into the cavity. Such a cover is, as has already been discussed in detail in the introduction, suitable for mounting on a substrate in accordance with the specified method. Here, bridging of contact surfaces of the assembly at different joining levels may be made possible by virtue of the contacting structure that is integrated into the inner side of the cover extending from the support surface, which lies at the level of the substrate (first joining level) to the top side of components whose contact surfaces lie at a higher level (second joining level). Thus, the use of the cover advantageously simplifies the method for mounting electrical components on substrates. The cover may advantageously be designed as an LTCC component or as an MID component. LTCC components are components which are produced by so-called LTCC technology.

This abbreviation stands for the method of "Low Temperature Co-Fired Ceramics", that is to say ceramics that are produced at low temperatures, and in the case of which electrical circuits or conductor paths, which can form the contacting structure, are burned in. The production of such components is known per se, for example from Boleslav Psota et al., "Usage of LTCC Technology in Electronic Packaging", 36th Int. Spring Seminar on Electronics Technology, IEEE 2013, page 206 onward.

If the cover is in the form of an MID component, this means that the so-called MID technology is used. Said abbreviation stands for a method in which so-called "Molded Interconnect Devices" are produced. The contacting structures are in this case for example cast into a component. Said technology is likewise generally known, for example from N. Bachnak, "3D-MID Technology MEMS Connectivity at System Level", IEEE 2012, page 572 onward.

It may be advantageous if, in the cover, an additional material is applied to the contact surfaces of the contacting structure. Here, as already discussed, said additional material may be a high-temperature solder, a diffusion solder or a sintering material. Said additional materials are then, after the mounting of the cover on the assembly, available for forming the joining connections. Joining can be performed in the manner already discussed above.

It may also be advantageous if the support surface is formed by an edge of the cover. The cover is then placed with its edge onto the substrate. If the edge is of encircling form, it is the case when the cover is placed onto the substrate that a closed cavity is formed, which advantageously ensures protection of the assembly against contamination and other environmental influences. It is furthermore also possible for the contact surfaces or the contact surfaces equipped with the additional material to be provided on the edge of the cover, because contacting of the contacting structure with the substrate can be realized in this way.

It may also be advantageous if the outer side of the cover is planar. This yields the advantages, already discussed above, of simplified mounting, because the joining tool can have a planar and thus simple geometry and can also be used for different cover geometries (with planar outer side). It is self-evidently advantageous if the outer side of the cover is formed parallel to the support surface, because the substrate, if it is mounted in a horizontal position, can also be mounted by virtue of the mounting tools being applied horizontally.

As materials for the electrical component, use may be made of silicon, silicon carbide, gallium arsenide or gallium nitride. Said materials are preferably used for power electronics components. The substrate may for example be manufactured from a ceramic. This may be coated with copper, silver or gold, wherein the coating may be structured in order to form electrical contact surfaces and conductor tracks. As additional materials, it is possible, depending on the joining method, for high-temperature solders such as antimony-containing alloys or conventional solders with high lead content, diffusion solders of the material systems Sn—Cu, Sn—Cu—Ni, Sn—Cu—Ag, and preferably silver-containing sinter pastes or sinter foils to be used. Below, the following examples of additional materials are mentioned by way of example:

Sintered Connections:

Silver sinter paste (e.g. Heraeus mAgic Paste, Microbond ASP series) with a temperature range of 200-280° C.

Diffusion-Soldered Connections:

Material system SnCu, SnAg, SnNi and further material systems which can form intermetallic phases with high melting point. Here, different formulations may be used, such as for example
- single-paste systems with particles of high melting point (e.g. Cu) dispersed in the base matrix composed of alloys with low melting point (such as SnCu),
- two-paste systems with sequential application methods (Cu, with high melting point, followed by SnCu alloy), or
- methods for applying the additional material with low melting point (e.g. SnCu alloy) between the boundary surfaces of high melting point (e.g. Cu), wherein the joining zone with high melting point is generated under process conditions by way of diffusive changes in concentration.

Figure 3:
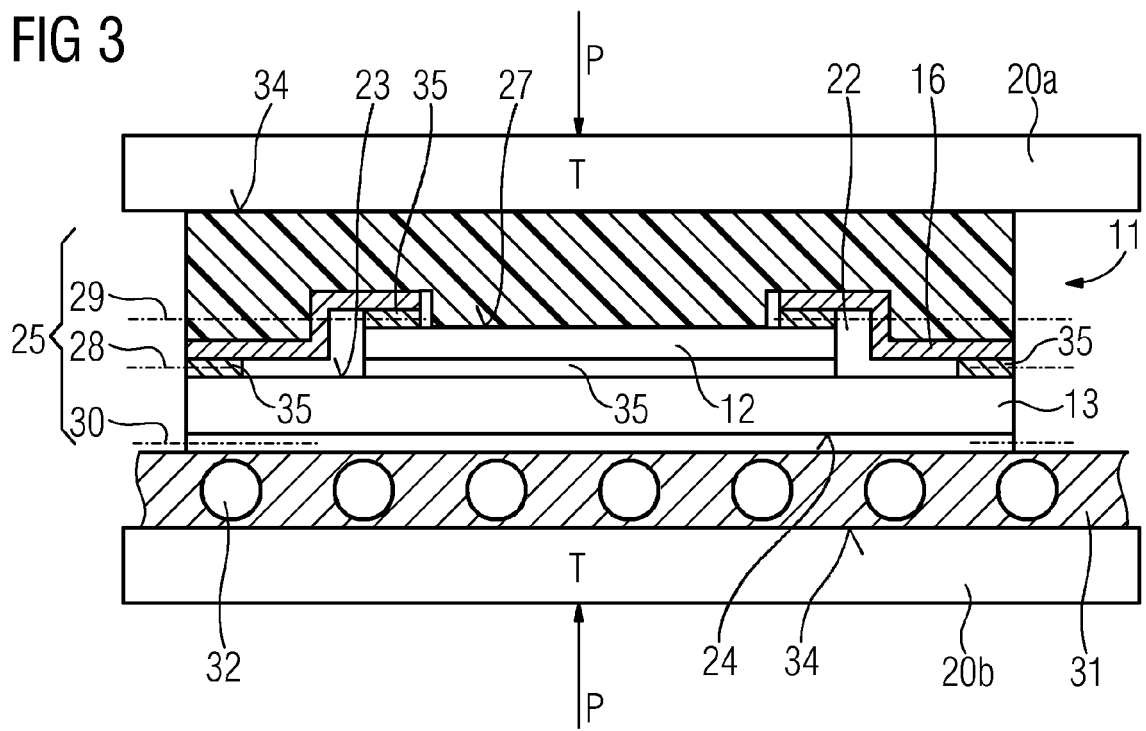

FIG. 1 illustrates a cover 11 which, as per FIG. 3, can be placed onto a substrate 13 equipped with an electrical component 12. The cover 11 is composed of a plastics material from which the MID component was produced. In the cover there is formed an inner side 18 in which contacting structures 16 have been cast in by MID technology or produced in some other way. The contacting structure 16 is thus integrated into the material of the cover, wherein the entire top side of the contacting structure 16 on the inner side of the cover 11 is exposed. On the ends of the contacting structure, which provides contact surfaces for contact purposes, an additional material 17 in the form of a diffusion solder is provided. The cover also has, in addition to the inner side 18 an outer side 19, wherein the outer side 19 is of planar form in order that a joining tool 20a with a planar pressure surface can be mounted onto the outer side 19 of the cover (cf. FIG. 3). In this case, a joining surface 15 is used which, as shown in FIG. 3, is placed onto a top side 27 of the component 12 to be mounted.

On the inner side 18 of the cover, there is also formed a support surface 21 which, in the section illustrated in FIG. 1, is provided by the additional material 17 on the outer edge of the cover. Where no additional material is provided, said support surface 21 may also be formed by the material of the cover 11 (not illustrated). The support surface serves, in a further method step, for being able to be placed directly onto the substrate. In this way, the interior of the cover can be sealed off with respect to the surroundings, such that a cavity 22 is formed in the interior (cf. FIG. 3).

Figure 2:
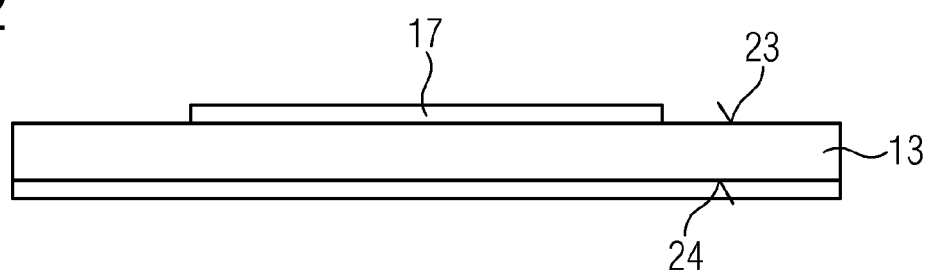
FIGS. 2 and 3 show side views of the example embodiment, to illustrate further method steps of the example embodiment of the method according to the invention.

FIG. 2 shows the substrate 13, which has a mounting side 23 and a rear side 24. Said substrate is a DCB ceramic substrate (not illustrated in any more detail), wherein the copper layers are not illustrated in any more detail. On the mounting side 23 and on the rear side 24 there are provided further regions with the additional material 17, where various joining partners are to be mounted at a later point in time (cf. FIG. 3). The copper layer (not illustrated) on the mounting side 23 is suitably structured in order that the component 12 to be mounted can be contacted in a suitable manner.

FIG. 3 illustrates how the electrical assembly to be mounted is designed. It can be seen that, on the mounting side 23 of the substrate 13, in the region of the additional material (cf. FIG. 2), the component 12 has been placed by way of its bottom side 26 onto the mounting side 23 of the substrate 13. Said component 12 has, on its top side 27, electrical contacts which are not illustrated in any more detail. The cover 11 as per FIG. 1 is placed onto the assembly thus formed composed of the substrate 13 and the component 12, wherein the contacting structures 16 come to lie by way of their ends and the additional material (cf. FIG. 1) against the top side 27 of the component 12 and against the mounting side 23 of the substrate 13. Here, it must be taken into consideration that the ends of the contacting structure 16 lie in each case at different levels, which in FIG. 3 are denoted as first joining level 28, predefined by the mounting side 23 of the substrate 13, and as second joining level 29, predefined by the top side 27 of the component 12. A third joining level 30 is provided by the bottom side 24 of the substrate 13. Said third joining level serves for the fastening of a base plate 31, which is designed as a cooling body and which, as a component part, is connected in thermally conductive fashion by way of the additional material (cf. FIG. 2) to the bottom side 24 of the substrate 13. For cooling purposes, it is for example possible for cooling ducts 32 to be provided in the base plate 23. The assembly as per FIG. 3 has now been pre-mounted. That is to say, the individual components (base plate 31, substrate 13, component 12, contacting structure 16) have been positioned relative to one another in the configuration to be produced. The additional material 17 ensures that said configuration has sufficient stability for handling purposes during the further manufacturing process. For this purpose, it is also possible for joining aids (not illustrated in any more detail) to be provided. These may be composed for example of external tools such as for example clamps. It is also possible for joining aids such as for example clip connections, to be integrated (not illustrated) into the individual component parts. The retention of the individual components of the assembly by way of said joining aids is merely provisional until the final mounting of the assembly is performed. The final mounting is likewise indicated in FIG. 3. The assembly is placed into a suitable tool. Said tool is composed of joining tools 20a, 20b which are, from below and from above, moved against the assembly 25 to be completed. The joining tools have contact surfaces 34 by way of which a pressure force P can be exerted on the components to be joined. Said contact surfaces 34 are advantageously of planar form, which is realized in that both the base plate 31 and the cover 11 suitably provide planar contact surfaces for the joining tools 20a, 20b. It is thus possible for a heater (not illustrated in any more detail) by way of which the joining tools are brought to the temperature T, to transmit the heat to the assembly 25 over the entire contact surface 34. The heat in the joining tools may be realized, for example, by way of an electrical resistance heater (not illustrated). Together with the required pressure force P, the additional material (cf. FIG. 1) is converted into joining connections 35 as per FIG. 3, such that, in this way, the assembly is permanently mounted.

What is claimed is:

1. A method for mounting an electrical component on a substrate, wherein the electrical component has a bottom side facing toward the substrate and a top side situated opposite said bottom side, the method comprising:

mounting the electrical component onto the substrate, thus connecting a bottom side of the electrical component to the substrate, forming a cover including integrated conductor paths located on an underside of the cover that define a contacting structure, wherein an outer side of the cover is planar over the entire areal extent of the cover, mounting the cover, after forming the cover to include the integrated conductor paths located on the underside of the cover that define the contacting structure, onto a mounting side of the substrate and onto the top side of the electrical component mounted on the substrate, such that:

the cover laterally traverses the electrical component, first contact surfaces of the contacting structure laterally outside the electrical component contact the substrate at a first joining level defined at the mounting side of the substrate, and electrical contact is generated between second contact surfaces of the contacting structure and the electrical component at a second joining level defined at the top side of the electrical component, the second joining level being different than the first joining level, mounting a rear side of the substrate, opposite the mounting side, to a component part at a third level, and completing a joining connection between the substrate and the component part at the third joining level, simultaneous with the completion of the joining connections at the first and second joining levels, via the temperature or pressure based joining process.

2. The method of claim 1, comprising, after mounting the electrical component to the substrate and mounting the cover onto the substrate and the electrical component, performing a temperature or pressure based joining process to complete joining connections between the cover and the electrical component at the first joining level and between the cover and the substrate at the second joining level.

3. The method of claim 2 wherein the completion of the joining connections is performed by diffusion soldering or sintering.

4. The method of claim 1, wherein the cover has a planar outer surface that runs parallel to the substrate.

5. The method of claim 1, comprising providing an additional material on contact surfaces of the contacting structure before mounting the cover onto the substrate.

* * * * *